United States Patent
Froitzheim et al.

(10) Patent No.: US 9,802,572 B2
(45) Date of Patent: Oct. 31, 2017

(54) DRIVER CIRCUIT FOR AN INDUCTOR COIL, METHOD FOR OPERATING AN INDUCTOR COIL AND ACTIVE TRANSMISSION SYSTEM WITH A DRIVER CIRCUIT

(71) Applicant: Continental Automotive GmbH, Hannover (DE)

(72) Inventors: Herbert Froitzheim, Pettendorf (DE); Dieter Sass, Regensburg (DE)

(73) Assignee: CONTINENTAL AUTOMOTIVE GMBH, Hanover (DE)

( * ) Notice: Subject to any disclaimer, the term of this patent is extended or adjusted under 35 U.S.C. 154(b) by 0 days.

(21) Appl. No.: 15/028,470

(22) PCT Filed: Sep. 29, 2014

(86) PCT No.: PCT/EP2014/070831
§ 371 (c)(1),
(2) Date: May 6, 2016

(87) PCT Pub. No.: WO2015/052033
PCT Pub. Date: Apr. 16, 2015

(65) Prior Publication Data
US 2016/0250995 A1    Sep. 1, 2016

(30) Foreign Application Priority Data

Oct. 11, 2013    (DE) .................. 10 2013 220 596

(51) Int. Cl.
B60R 25/20    (2013.01)
H03K 17/13    (2006.01)
(Continued)

(52) U.S. Cl.
CPC .......... *B60R 25/209* (2013.01); *B60R 25/241* (2013.01); *H03K 17/133* (2013.01); *H04B 5/0081* (2013.01)

(58) Field of Classification Search
CPC .. H03K 17/133; H04B 5/0081; B60R 25/241; B60R 25/09
See application file for complete search history.

(56) References Cited

U.S. PATENT DOCUMENTS

| | | | |
|---|---|---|---|
| 3,582,734 A | 6/1971 | Bryden | 361/152 |
| 4,980,898 A | 12/1990 | Silvian | 375/295 |

(Continued)

FOREIGN PATENT DOCUMENTS

| | | | | |
|---|---|---|---|---|
| DE | 19702841 A1 | 7/1998 | | A61N 1/39 |
| DE | 102005032379 A1 | 1/2007 | | B60R 25/00 |

(Continued)

OTHER PUBLICATIONS

German Office Action, Application No. 102013220596.1, 6 pages, dated Jul. 8, 2014.

(Continued)

*Primary Examiner* — Thomas Alunkal
(74) *Attorney, Agent, or Firm* — Slayden Grubert Beard PLLC

(57) ABSTRACT

In some embodiments of the present disclosure, a method for operating an inductor coil may include: charging a capacitor by means of a charging current at a reference voltage; and discharging the charged capacitor in an oscillating manner via the inductor coil. The discharging is ended when a current passing through the inductor coil has passed through an entire oscillation period or a multiple thereof.

19 Claims, 3 Drawing Sheets

(51) Int. Cl.
*B60R 25/24* (2013.01)
*H04B 5/00* (2006.01)

(56) References Cited

U.S. PATENT DOCUMENTS

| | | | | |
|---|---|---|---|---|
| 5,214,340 | A * | 5/1993 | Suzuki | B41J 2/30 |
| | | | | 310/316.03 |
| 7,679,220 | B2 * | 3/2010 | Yu | H03K 17/296 |
| | | | | 307/112 |
| 8,471,642 | B2 * | 6/2013 | Hill | H03J 1/0008 |
| | | | | 327/553 |
| 2007/0194769 | A1 * | 8/2007 | Yamashita | H02M 3/158 |
| | | | | 323/282 |
| 2009/0243795 | A1 * | 10/2009 | Ghabra | B60R 25/246 |
| | | | | 340/5.72 |
| 2009/0261946 | A1 * | 10/2009 | Tenconi | G07C 9/00309 |
| | | | | 340/5.72 |
| 2014/0097823 | A1 * | 4/2014 | Svorc | H02M 3/158 |
| | | | | 323/312 |
| 2015/0032396 | A1 * | 1/2015 | Pazhayaveetil | H03G 3/004 |
| | | | | 702/65 |

FOREIGN PATENT DOCUMENTS

| | | | | |
|---|---|---|---|---|
| DE | 102009023855 A1 | 12/2010 | | A61N 2/04 |
| JP | 4293320 A | 10/1992 | | H04B 1/04 |
| JP | 09321652 A | 12/1997 | | G06K 17/00 |
| JP | 10243546 A | 9/1998 | | G06K 17/00 |
| JP | 2006279237 A | 10/2006 | | B60R 25/01 |
| JP | 2011028450 A | 2/2011 | | G06K 17/00 |
| WO | 2015/052033 A1 | 4/2015 | | B60R 25/00 |

OTHER PUBLICATIONS

International Search Report and Written Opinion, Application No. PCT/EP2014/070831, 19 pages, dated Jan. 5, 2015.
Japanese Office Action, Application No. 2016522034, 6 pages, dated Apr. 27, 2017.

* cited by examiner

DRIVER CIRCUIT FOR AN INDUCTOR COIL, METHOD FOR OPERATING AN INDUCTOR COIL AND ACTIVE TRANSMISSION SYSTEM WITH A DRIVER CIRCUIT

CROSS-REFERENCE TO RELATED APPLICATIONS

This application is a U.S. National Stage Application of International Application No. PCT/EP2014/070831 filed Sep. 29, 2014, which designates the United States of America, and claims priority to DE Application No. 10 2013 220 596.1 filed Oct. 11, 2013, the contents of which are hereby incorporated by reference in their entirety.

TECHNICAL FIELD

The invention relates to a driver circuit for an inductor coil, in particular an inductive antenna, a method for operating an inductor coil, and an active transmission system with a driver circuit.

BACKGROUND

Keyless vehicle access and starting systems, for example, the passive start entry (PASE) system, are automatic systems for unlocking a vehicle without actively using a car key and for starting it by merely actuating the start button. This is enabled by an electronic key with chip, which the vehicle driver carries with him. A coded response signal is periodically emitted by the vehicle via at least one antenna located on the vehicle on an LF frequency (LF stands for "low frequency" having frequencies between 20 kHz and 200 kHz, for example). The system then goes into a receiving mode in the UHF range (UHF stands for "ultra high frequency" having frequencies in the three-digit megahertz range, for example) and waits for confirmation. If a key equipped with a transponder is in range, it receives the LF signal, decodes it, and emits it again with a new coding as the UHF signal. The UHF signal is decoded in the vehicle. Since the vehicle knows both coding tables, it can compare the actual original emission to the signal just received and permit access if they correspond. If there is no correct response within a defined time, nothing happens and the system switches back to standby. The engine start procedure essentially corresponds to that of the access control, except that the engine start button is actuated here.

An inductive antenna, which is embodied, for example, as a ferrite core provided with a winding (also referred to as a magnet antenna or ferrite antenna) is predominantly used as the antenna for emitting the LF signal. The inductor coil of the inductive antenna is frequently driven in this case together with a capacitor in a resonant circuit. The power consumption of such a resonant circuit is typically kept low by the highest possible quality and exact frequency tuning, to keep the overall power consumption of the access and starting system as low as possible. A low power consumption is already desirable solely because, for example, otherwise the vehicle battery would be rapidly discharged during a longer shutdown time of the vehicle. A high quality restricts the transmission data rate, however, and exact tuning at high quality requires some expenditure. Common arrangements therefore usually represent an unsatisfactory compromise between data rate, expenditure, and power consumption.

SUMMARY

In an example embodiments of the present teachings, a driver circuit for an inductor coil (1) may comprise: a capacitor (4); two input paths for supplying a reference voltage (Ur) for the capacitor (4); two output paths for connecting the inductor coil (1) to the capacitor (4); a first controllable switch (5), which is connected in one of the two input paths; a second controllable switch (7), which is connected in one of the two output paths; a current measuring unit (8), which is connected in one of the two output paths and is designed to measure the current (Ia) flowing through the inductor coil (1); and a switch control unit (9), which is connected downstream of the current measuring unit (8), analyzes the current (9) flowing through the inductor coil (1), and is designed to firstly close the first switch (5) when the second switch (7) is open, in order to charge the capacitor (4) to the reference voltage (Ur), and then to open the first switch (5) and close the second switch (7) in order to discharge the capacitor (4) via the inductor coil (1) in an oscillating manner. The the second switch (7) is first opened again when the current (Ia) through the inductor coil (1) has passed through an entire oscillation period or a multiple thereof.

In some embodiments, a current limiting unit (6) or a current impressing unit is connected in series to the first switch (5).

In some embodiments, the switch control unit (9) is designed to detect the zero crossings of the measured current (Ia) and to open the second switch (7) after two zero crossings or an integer multiple of two zero crossings.

In some embodiments, the switch control unit (9) has a modulation input for a modulation signal (MOD) and is designed to control switching cycles of the first switch (5) and the second switch (7) as a function of the modulation signal (MOD).

In some embodiments, the switch control unit (9) is designed to carry out phase shift keying modulation or amplitude shift keying modulation or frequency shift keying modulation.

In some embodiments, at least the first switch (5) and the second switch (7) are embodied as controllable semiconductor components.

In some embodiments, the current measuring unit (8) is embodied as an ohmic resistor.

In some embodiments, the current measuring unit is designed to analyze the discharge of the voltage at the capacitor (4).

In some embodiments, a resonant circuit formed by the capacitor (4) and the inductor coil (1) has a resonant frequency which is higher than a carrier frequency provided for the transmission.

In some embodiments, the resonant frequency is 5 to 30% higher than the carrier frequency provided for the transmission.

In some embodiments, a third controllable switch (10) is connected in parallel to the capacitor (4), which switch is controlled such that it short-circuits the capacitor (4) to deactivate the driver circuit.

In one example method for operating an inductor coil (1): a capacitor (4) is charged by means of a charging current at a reference voltage (Ur); and the charged capacitor (4) is discharged in an oscillating manner via the inductor coil (1). The discharging is ended when the current (Ia) through the inductor coil (1) has passed through an entire oscillation period or a multiple thereof.

In some embodiments, the charging current of the capacitor (Ia) is limited or impressed.

In some embodiments, zero crossings of the measured current (Ia) are detected and after two zero crossings or an integer multiple of two zero crossings, the discharging of the capacitor (4) is ended.

In some embodiments, charging and discharging cycles of the capacitor (4) are controlled as a function of a modulation signal (MOD).

In some embodiments, phase shift keying modulation or amplitude shift keying modulation or frequency shift keying modulation is carried out on the basis of the modulation signal (MOD).

In some embodiments, the discharge of the voltage at the capacitor (4) is analyzed for the current measurement.

In some embodiments, the capacitor (4) is short-circuited to deactivate the driver circuit.

In one example of the present teachings, an active transmission system may include: an inductive antenna (1); a capacitor (4); a reference voltage (Ur); two input paths, which are connected between reference voltage (Ur) and capacitor (4); two output paths, which are connected between the inductive antenna (1) and the capacitor (4); a first controllable switch (5), which is connected in one of the two input paths; a second controllable switch (7), which is connected in one of the two output paths; a current measuring unit (8), which is connected in one of the two output paths and is designed to measure the current (Ia) flowing through the inductive antenna (1); and a switch control unit (9), which is connected downstream of the current measuring unit (8), analyzes the current (Ia) flowing through the inductive antenna (1), and is designed to firstly close the first switch (5) when the second switch (7) is open, in order to charge the capacitor (4) using the reference voltage (Ur), and then to open the first switch (5) and close the second switch (7), in order to discharge the capacitor (1) via the inductive antenna (1) in an oscillating manner. The second switch (7) is first opened again when the current (Ia) through the antenna (1) has passed through an entire oscillation period or a multiple thereof.

BRIEF DESCRIPTION OF THE DRAWINGS

The invention will be explained in greater detail hereafter on the basis of the exemplary embodiments illustrated in the figures of the drawing. In the figures.

DETAILED DESCRIPTION

Figure 1:
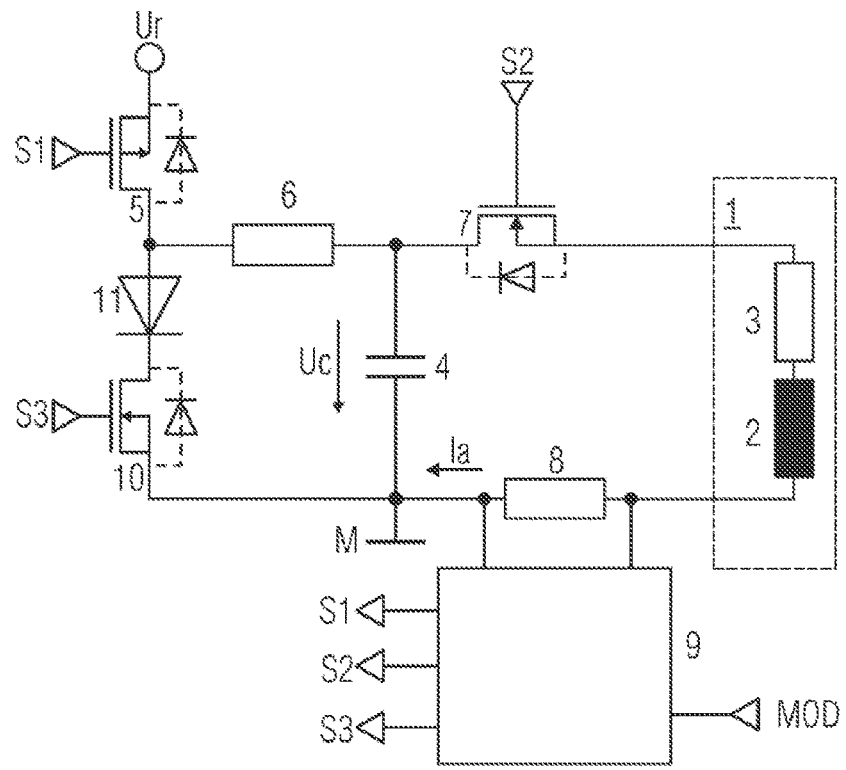
FIG. 1 shows a circuit diagram of an exemplary driver circuit for an inductor coil in an application as an active transmission system for LF signals.

The teachings of the present disclosure may be incorporated in a driver circuit for an inductor coil. Furthermore, the teachings may be used for a method for operating an inductor coil and an active transmission system having a resonant circuit.

In some embodiments, a driver circuit for an inductor coil comprises a capacitor, two input paths for supplying a reference voltage for the capacitor, and two output paths for connecting the inductor coil to the capacitor. Furthermore, the driver circuit comprises a first controllable switch, which is connected in one of the two input paths, and a second controllable switch, which is connected in one of the two output paths. A current measuring unit is connected in one of the two output paths and is designed to measure the current flowing through the inductor coil. A switch control unit, which is connected downstream of the current measuring unit, analyzes the current flowing through the inductor coil and is designed to firstly close the first switch when the second switch is open, in order to charge the capacitor with the reference voltage, and then to open the first switch and close the second switch in order to discharge the capacitor via the inductor coil in an oscillating manner, wherein the second switch is first opened again when the current through the inductor coil has passed through an entire oscillation period or a multiple thereof.

Advantages of the example driver circuit may include a low expenditure for circuitry and alignment, a low power consumption, a lower interfering signal emission, and/or a lower sensitivity to dimensioning tolerances.

Furthermore, a current limiting unit or a current impressing unit can be connected in series to the first switch, so that the capacitor, switch, or reference voltage source is not overloaded.

The switch control unit can detect the zero crossings of the measured current and to open the second switch after two zero crossings or an integer multiple of two zero crossings. The detection of the zero crossings represents a simple and efficient possibility for establishing the end of an oscillation period.

The switch control unit can have a modulation input for a modulation signal and can be designed to control switching cycles of the first switch and the second switch as a function of the modulation signal, to advantageously open up manifold possible applications.

The switch control unit can furthermore carry out phase shift keying modulation or amplitude shift keying modulation or frequency shift keying modulation of the antenna current. The switch control unit offers an effective quality of 1 during modulation, while the resonant circuit is operated with a high quality and therefore in a very energy-saving manner.

At least first switch and second switch can be controllable semiconductor components, whereby switching procedures can also be executed at higher switching frequencies in a simple manner and with low expenditure.

The current measuring unit can be an ohmic resistor, whereby currents can be measured in a simple manner and with low expenditure.

However, the current measuring unit can also analyze the discharge of the voltage at the capacitor, if a current measurement is not desired or is not practical.

The resonant circuit formed by capacitor and inductor coil may have a resonant frequency which is higher than a carrier frequency provided for the transmission. The resonant frequency can be, for example, 5 to 30% higher than the carrier frequency provided for the transmission.

A third controllable switch can be connected in parallel to the capacitor, and controlled such that it short-circuits the capacitor to deactivate the driver circuit. Therefore, a defined voltage can be impressed on the capacitor, for example, 0 V, in the deactivated state.

In some embodiments, a method for operating an inductor coil, wherein a capacitor is charged by means of a charging current at a reference voltage, the charged capacitor is discharged in an oscillating manner via the inductor coil, wherein the discharging is ended when the current through the inductor coil has passed through an entire oscillation period or a multiple thereof. Such a method is very efficient and requires little expenditure when it is carried out.

The charging current of the capacitor can also be limited or impressed to protect from overcurrents.

Furthermore, in the example method, the zero crossings of the measured current can be detected and after two zero crossings or an integer multiple of two zero crossings, the discharging of the capacitor can be ended. The detection of the zero crossings represents a simple and efficient possibility for determining the end of an oscillation period.

In particular during the use as a transmission system, the charging and discharging cycles of the capacitor can be controlled as a function of a modulation signal.

In this case, phase shift keying modulation or amplitude shift keying modulation or frequency shift keying modulation can be carried out on the basis of the modulation signal. The charging and discharging cycles can be embodied such that the modulation takes place with an effective quality of 1, but the resonant circuit is operated at a high quality, whereby the operation is very energy-saving.

Alternatively, the discharge of the voltage at the capacitor can also be analyzed for the current measurement.

The capacitor can additionally, possibly also for protection from overcurrents, be short-circuited by means of a current limiting unit or current impressing unit, to deactivate the driver circuit, so that a defined state exists on the capacitor in the deactivated state.

Some embodiments may comprise an active transmission system with an inductive antenna, a capacitor, and a reference voltage. In addition, it comprises two input paths, which are connected between reference voltage and capacitor, and two output paths, which are connected between the inductive antenna and the capacitor. A first controllable switch is connected in one of the two input paths and a second controllable switch is connected in one of the two output paths. In addition, a current measuring unit is connected in one of the two output paths and measures the current flowing through the inductive antenna. A switch control unit, which is connected downstream of the current measuring unit, analyzes the current flowing through the inductive antenna and is designed to firstly close the first switch when the second switch is open, in order to charge the capacitor using the reference voltage, and then to open the first switch and close the second switch, in order to discharge the capacitor via the inductive antenna in an oscillating manner, wherein the second switch is first opened again when the current through the antenna has passed through an entire oscillation period or a multiple thereof. Such an active transmission system can advantageously be used, for example, in the scope of a keyless vehicle access and starting system, for example, the passive start entry (PASE) system.

FIG. 1 shows an exemplary embodiment of a driver circuit for an inductor coil, which is provided in the present case by an inductive antenna 1, for example, a ferrite antenna, in an application as an active transmission system. The inductive antenna 1 can alternately, as shown in FIG. 1, be described by an electrical series circuit made of a solely inductive component 2 and an ohmic component 3. A capacitor 4 is connected, on the one hand, to two input paths for supplying a reference voltage Ur, which is in reference to ground M, and two output paths for connecting the inductive antenna 1. In this case, a first controllable switch 5 is connected in the upper of the two input paths, wherein it could alternatively also be connected in the lower of the two input paths.

An ohmic resistor 6, which is used for current limiting in the input paths, is connected in series to the switch 5. Instead of the ohmic resistor 6, a current source or another type of current impressing unit or current limiting unit could also be used. A second controllable switch 7 is connected in the upper of the two output paths and an ohmic resistor 8, which is used as a measurement resistor for measuring the current Ia flowing through the inductive antenna 1 as a current measuring unit, is connected in the lower of the two input paths. Alternatively, the switch 7 and the resistor 8 could also be arranged in the same input path in each case or the respective input paths can be exchanged with one another. The discharge of the voltage at the capacitor (4) can alternatively also be analyzed for the current measurement.

Furthermore, the driver circuit comprises a switch control unit 9, which taps a voltage via the resistor 8, which is proportional to the current Ia through the resistor 8 and therefore to the current through the antenna 1, and analyzes it, for example, determines the zero crossings of the current Ia. In the case of open second switch 7, under the control of the switch control unit 9, the first switch 5 is closed by means of the control signal S1, to charge the capacitor 4 to the reference voltage Ur. Subsequently, the first switch 5 is then opened and the second switch 7 is closed by means of the control signal S2, to discharge the capacitor 4 via the inductive antenna 1 in an oscillating manner, i.e., executing at least one complete oscillation, wherein the second switch 7 is first opened again when the current Ia through the inductive antenna 1 has passed through an entire oscillation period (or a multiple thereof). The switch control unit 9 additionally has a modulation input for a modulation signal MOD, which is described in greater detail hereafter.

Optionally, still a third controllable switch 10, possibly together with a diode 11 connected in series, can be connected directly to the capacitor 4 or—as shown—connected in parallel via the resistor 6, which is controlled by means of a control signal S3 such that it short-circuits the capacitor 4 and/or discharges it to deactivate the driver circuit.

In the present exemplary embodiment, field effect transistors, in particular MOS field effect transistors (MOS is the abbreviation for the term "metal oxide semiconductor") are used as the controllable switches 5, 7, and 10, wherein the controllable switch 5 is a MOS field effect transistor of the p-channel type, while the controllable switches 7 and 10 are of the n-channel type. In addition to the MOS field effect transistors (of any conduction type) shown, all other types of suitable controllable switches, in particular controllable semiconductor switches, can also be used, self-evidently also in conjunction with corresponding drivers, bootstrap circuits, charge pumps, or the like.

Figure 2:
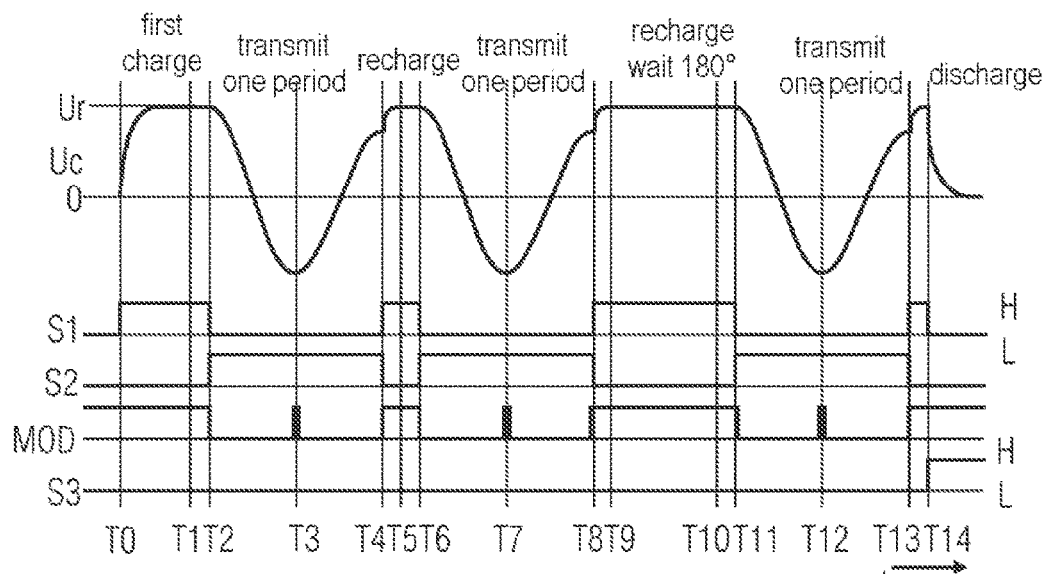
FIG. 2 shows a diagram of the curve of the voltage over the capacitor of the driver circuit in relation to control signals of the switches and a modulation signal.

The curve of the voltage Uc over the time t at the capacitor 4 as a function of the control signals S1, S2, and S3 for the case of biphase shift keying modulation (BPSK modulation) is shown in FIG. 2. At the beginning, at a time T0, the sequence begins with the first charging of the capacitor 4 from, for example, 0 V to the reference voltage Ur and the voltage Uc over the capacitor 4 rises accordingly from, for example, 0 V to the reference voltage Ur (in the present case exponentially). The complete charge is achieved at a time T1. To also ensure a complete charge in the event of small deviations in the operating conditions, the switching over between the first switch 5, which is closed for the charging, (switch 7 open) and the second switch 7, which is closed for the oscillating discharging, (switch 5 open) occurs somewhat later than time T1, namely at a time T2.

The phase of the oscillating discharging of the capacitor 4 is therefore initiated at time T2. Accordingly, the voltage Uc over the capacitor 4 now drops again (in the present case cosinusoidal), firstly reaches zero, and then the behavior of the resonant circuit formed from the capacitor 4 and the antenna 1 corresponds to a negative maximum with a quality-dependent amplitude at a time T3, to then rise again approximately to a relative positive maximum with a quality-dependent amplitude at a time T4. The positive maximum is more or less approximately equal to the reference voltage Ur, but in all cases is smaller than it. During the oscillating discharging phase, the antenna 1 emits an electromagnetic signal. At time T4, a recharging phase then begins, during which the full charge is reached at a time T5. The switching over from the charging to the oscillating discharging again occurs, however, for the above-explained reasons, at a somewhat later time T6. An oscillating discharging phase then follows again until a time T8, including reaching the negative maximum at a time T7.

A recharging phase then follows again beginning with time T8, until the full charge is reached at a time T9. However, this is followed by a longer waiting time until a time T11, which is owing to a 180° phase shift because of the BPSK modulation. For comparison, a time T10 is also plotted in FIG. 2, which specifies the minimum waiting time between times T10 and T11. From time T11, oscillating discharging again occurs up to a time T13, a negative maximum at a time T12. Recharging then occurs again up to time T14, which is terminated by means of the switch 10, because of the deactivation of the driver circuits, at time T14 by a final discharge to approximately 0 V (possibly diode voltage via diode 11).

Corresponding to the switching behavior of the switches 5, 7, 10, the control signal S1 is at the level H during each charging phase (between times T0 to T1, T4 to T6, T8 to T1, T13 to T14) and the control signal S2 is initially at the level L. For the respective following discharging phase (between times T2 to T4, T6 to T8, T11 to T13), the control signal S1 changes to the level L and the control signal S2 changes to the level H. The control signal S3 is at the level L up to the final discharge at time T14 and is then at the level H. For better comprehension, in the exemplary embodiment according to FIG. 2, the level H fundamentally stands for a closed switch (conductive) and the level L for an open switch (nonconductive). However, depending on the type of a single switch or all actually used switches and the specific signal-switching configurations thereof, actual activation signals deviating therefrom can result.

The modulation signal MOD, which the curve of the voltage Uc over the capacitor 4 as shown in FIG. 2 has as a consequence, is also shown in FIG. 2. The modulation signal MOD takes the level H up to time T2, then the level L up to time T3, the level H at time T3, then the level L up to time T4, the level H from time T4 to time T6, the level L from time T6 to time T8, with the exception of the level H at time T7, the level H from time T8 to time T11, and the level L from time T11 to time T13, with the exception of level H at time T13. The modulation signal MOD therefore essentially takes the level H in the charging phases of the capacitor 4 and upon the occurrence of the negative maximum of the voltage Uc at the capacitor 4 and otherwise takes the level L.

Figure 3:
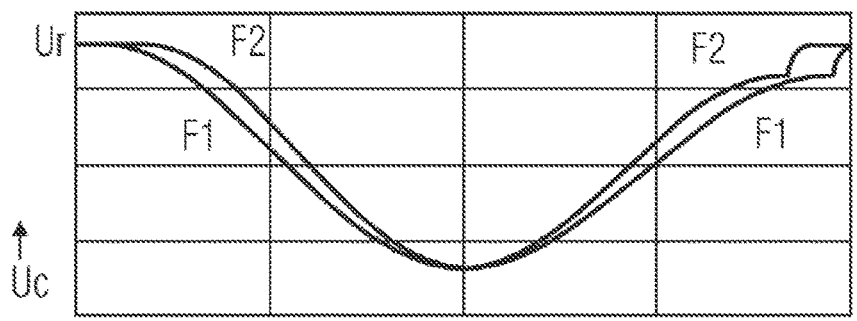
FIG. 3 shows a diagram of the curve of the voltage over the capacitor of the driver circuit at different resonant frequencies in relation to the carrier frequency.
Figure 4:
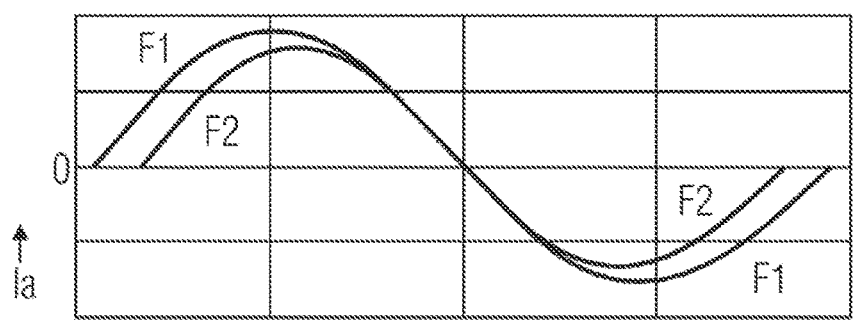
FIG. 4 shows a diagram of the curve of the current, corresponding to the voltage curve according to FIG. 3, through the antenna.

FIG. 3 shows, once again in detail, the curve of the voltage Uc at the capacitor 4 over the time t at two different resonant frequencies F1 and F2, wherein resonant frequency F1 is 5% higher than a desired carrier frequency and the resonant frequency F2 is 30% higher than the desired carrier frequency. FIG. 4 shows the current curve Ia corresponding thereto in each case over the time t for the two resonant frequencies F1 and F2, as it is represented, for example, at the resistor 8. As expected, phase shift between the respective voltages and currents is approximately 90°.

Figure 5:
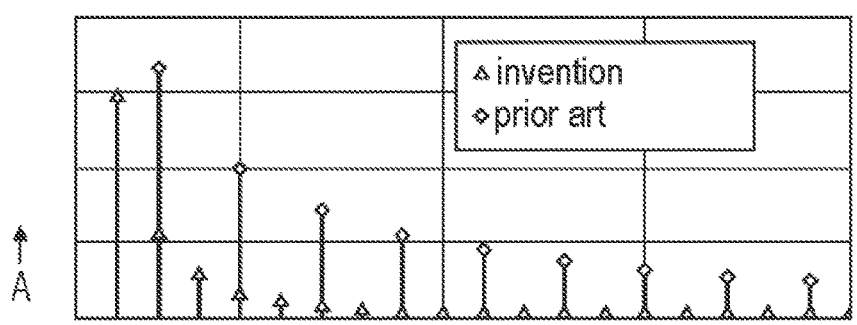
FIG. 5 shows a comparative diagram of the harmonics generated in the case of conventional square-wave operation and in the case of use of the driver circuit according to the invention.

FIG. 5 schematically shows the resulting harmonics in the spectra of the signals emitted by the antenna 1 as amplitudes A of the harmonics over the frequency f, wherein both cases are based upon a fundamental oscillation having the same amplitude (not shown). As can be seen, the present method is significantly more favorable in relation to known methods using square-wave signals with respect to the energy contributed by the harmonics because it generates less interfering energy with regard to the electromagnetic compatibility (EMC), with less expenditure in addition, as is apparent from the circuit according to FIG. 1. In the case of square-wave operation of the antenna, only odd harmonics are generated, while in the present case both even and also odd harmonics are generated. The behavior of the present driver circuit results from the fact that the current Ia flowing through the antenna 1 is sinusoidal over a broad range and only the interruption during the recharging time between the sinusoidal oscillation procedures contributes to the generation of harmonic components. The amplitudes of the fundamental oscillation and the harmonics change in this case with the ratio between the antenna resonant frequency and the carrier frequency.

Figure 6:
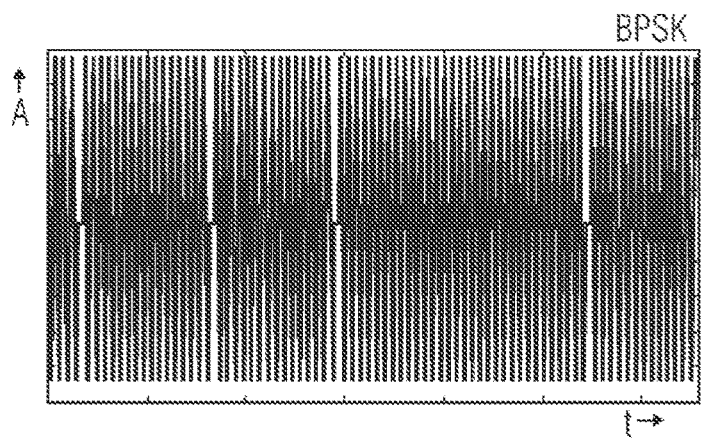
FIG. 6 shows a diagram of the curve of the antenna signal in the case of biphase shift keying modulation.
Figure 7:
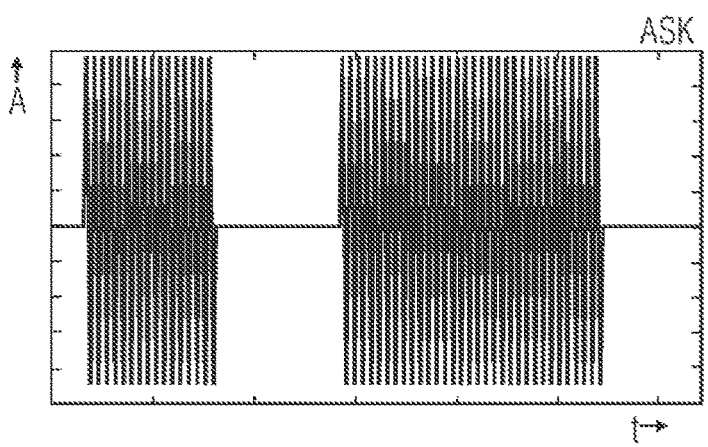
FIG. 7 shows a diagram of the curve of the antenna signal in the case of amplitude shift keying modulation.
Figure 8:
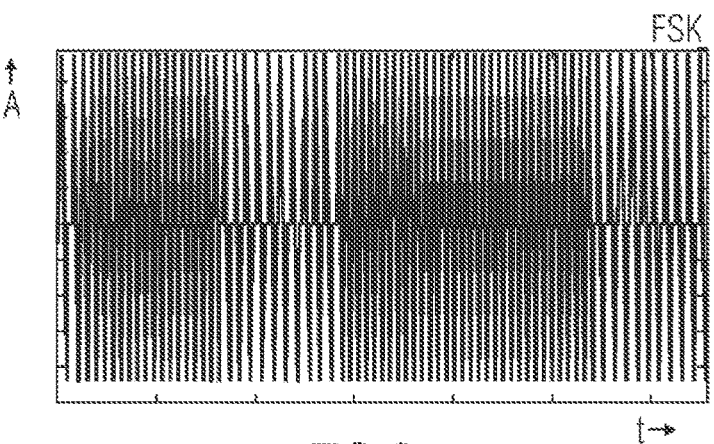
FIG. 8 shows a diagram of the curve of the antenna signal in the case of frequency shift keying modulation.

The example according to FIG. 2 was based upon a BPSK modulation. The transmission signal resulting therefrom as the amplitude A over the time t is shown in detail in FIG. 6. In the same manner, many other types of modulation are also alternatively suitable, for example, ASK modulation (ASK stands for "amplitude shift keying"), the associated transmission signal of which is shown in FIG. 7, or FSK modulation (FSK stands for "frequency shift keying"), the associated transmission signal of which is shown in FIG. 8.

In the present driver circuit, BPSK modulation means that 180° phase shifts are inserted into the carrier signal as a function of the logical value to be transmitted. For example, a phase shift of 0° can be provided for the logical value L and a phase shift of 180° can be provided for the logical value H. In the present driver circuit, a phase shift by 180° is achieved in that the respective imminent discharging procedure is carried out with a delay by a corresponding time. Although, in the present driver circuit, the quality factor Q is very high in any case, BPSK modulation is generated immediately, so that the quality factor Q appears to be equal to one. Accordingly, the power loss is extremely low, since the resonant circuit made of capacitor 4 and antenna 1 does not have to be discharged for the purposes of the modulation.

In the case of ASK modulation, two different amplitudes are generated as a function of the logical value to be transmitted. In a special form, OOK (on-off keying), one of the amplitude values is zero and the other is the maximum value, for example. With reference to the present driver circuit, this special type of the modulation has the consequence that the antenna 1 remains turned off the entire time, for example, until the logical value L is to be transmitted, otherwise, the antenna 1 is turned on when the logical value H is to be transmitted. This corresponds to a phase shift of n times 360° for a duration of n carrier periods. The quality factor is also one in this case and no energy is also withdrawn from the system for modulation here.

FSK modulation provides a separate carrier frequency for each logical value. In the present driver circuit, a corresponding phase shift is inserted after each discharging phase for this purpose for generating a lower carrier frequency than the nominal carrier frequency. The quality factor is also one in this case and no energy is also withdrawn from the system for modulation here.

The driver circuit incorporating teachings of the present disclosure and the active transmission system provide high oscillation circuit quality factors Q without impairing the transmission quality at the same time and without requiring a specific quality factor Q, the EMC emissions are comparatively very low, the power loss is very low, and by using multiplexers, multiple different antennas can also be operated using the same driver.

LIST OF REFERENCE NUMERALS 1 antenna
2 solely inductive component
3 solely ohmic component
4 capacitor
5 first controllable switch
6 current limiting unit, resistor
7 second controllable switch
8 current measuring unit, resistor
9 switch control unit
10 third controllable switch
11 diode
A amplitude
f frequency
F1 resonant frequency
F2 resonant frequency
H level
Ia current
L level
M ground
MOD modulation signal
Q quality factor
S1 control signal
S2 control signal
S3 control signal
t time
T0-T14 times
Uc voltage at the capacitor
Ur reference voltage

What is claimed is:

1. A driver circuit for an inductor coil, the driver circuit comprising:
   a capacitor,
   two input paths for supplying a reference voltage for the capacitor,
   two output paths for connecting the inductor coil to the capacitor,
   a first controllable switch connected in one of the two input paths,
   a second controllable switch connected in one of the two output paths,
   a current measuring unit connected in one of the two output paths to measure a current flowing through the inductor coil, and
   a switch control unit connected downstream of the current measuring unit to analyze the current flowing through the inductor coil, and to firstly close the first switch when the second switch is open, in order to charge the capacitor to the reference voltage, and then to open the first switch and close the second switch in order to discharge the capacitor via the inductor coil creating an oscillating current through the current measuring unit,
   wherein the second switch is first opened again when the current through the inductor coil has passed through an entire oscillation period or a multiple thereof.

2. The driver circuit as claimed in claim 1, further comprising a current limiting unit or a current impressing unit connected in series to the first switch.

3. The driver circuit as claimed in claim 1, wherein the switch control unit detects the zero crossings of the measured current and opens the second switch after two zero crossings or an integer multiple of two zero crossings.

4. The driver circuit as claimed in claim 1, wherein the switch control unit includes a modulation input for a modulation signal and controls switching cycles of the first switch and the second switch as a function of the modulation signal.

5. The driver circuit as claimed in claim 4, wherein the switch control unit carries out phase shift keying modulation or amplitude shift keying modulation or frequency shift keying modulation.

6. The driver circuit as claimed in claim 1, wherein the first switch and the second switch comprise controllable semiconductor components.

7. The driver circuit as claimed in claim 1, wherein the current measuring unit comprises an ohmic resistor.

8. The driver circuit as claimed in claim 1, wherein the current measuring unit analyzes the discharge of the voltage at the capacitor.

9. The driver circuit as claimed in claim 1, wherein a resonant circuit formed by the capacitor and the inductor coil has a resonant frequency which is higher than a carrier frequency provided for the transmission.

10. The driver circuit as claimed in claim 9, wherein the resonant frequency is 5 to 30% higher than the carrier frequency provided for the transmission.

11. The driver circuit as claimed in claim 1, further comprising a third controllable switch connected in parallel to the capacitor, the third controllable switch operable to short-circuit the capacitor to deactivate the driver circuit.

12. A method for operating an inductor coil, the method comprising:
    charging a capacitor by means of a charging current at a reference voltage; and
    discharging the charged capacitor via the inductor coil creating an oscillating current through a current measuring unit in series with the capacitor,
    wherein the discharging is ended when a current passing through the inductor coil has passed through an entire oscillation period or a multiple thereof.

13. The method as claimed in claim 12, wherein the charging current of the capacitor is limited or impressed.

14. The method as claimed in claim 12, wherein zero crossings of the measured current are detected and after two zero crossings or an integer multiple of two zero crossings, the discharging of the capacitor is ended.

15. The method as claimed in claim 12, wherein charging and discharging cycles of the capacitor are controlled as a function of a modulation signal.

16. The method as claimed in claim 15, further comprising carrying out phase shift keying modulation or amplitude shift keying modulation or frequency shift keying modulation on the basis of the modulation signal.

17. The method as claimed in claim 12, further comprising analyzing the discharge of the voltage at the capacitor for the current measurement.

18. The method as claimed in claim 12, further comprising short-circuiting the capacitor to deactivate the driver circuit.

19. An active transmission system comprising:
an inductive antenna,
a capacitor,
a reference voltage source,
two input paths connected between reference voltage source and capacitor,
two output paths connected between the inductive antenna and the capacitor,
a first controllable switch connected in one of the two input paths,
a second controllable switch connected in one of the two output paths,
a current measuring unit connected in one of the two output paths to measure a current flowing through the inductive antenna, and
a switch control unit connected downstream of the current measuring unit to analyze the current flowing through the inductive antenna, and to firstly close the first switch when the second switch is open, in order to charge the capacitor using the reference voltage source, and then to open the first switch and close the second switch, in order to discharge the capacitor via the inductive antenna creating an oscillating current through the current measuring unit, wherein the second switch is first opened again when the current through the antenna has passed through an entire oscillation period or a multiple thereof.

* * * * *